US012062524B2

(12) United States Patent
Zhao et al.

(10) Patent No.: US 12,062,524 B2
(45) Date of Patent: *Aug. 13, 2024

(54) PLASMA REACTOR HAVING A VARIABLE COUPLING OF LOW FREQUENCY RF POWER TO AN ANNULAR ELECTRODE

(71) Applicant: Advanced Micro-Fabrication Equipment Inc, Shanghai, Shanghai (CN)

(72) Inventors: Kui Zhao, Shanghai (CN); Shenjian Liu, Shanghai (CN); Tuqiang Ni, Shanghai (CN)

(73) Assignee: ADVANCED MICRO-FABRICATION EQUIPMENT INC. CHINA, Shanghai (CN)

(*) Notice: Subject to any disclaimer, the term of this patent is extended or adjusted under 35 U.S.C. 154(b) by 100 days.

This patent is subject to a terminal disclaimer.

(21) Appl. No.: 16/025,995

(22) Filed: Jul. 2, 2018

(65) Prior Publication Data
US 2019/0006155 A1   Jan. 3, 2019

(30) Foreign Application Priority Data
Jul. 3, 2017   (CN) .......................... 201710533117.X

(51) Int. Cl.
H01J 37/32   (2006.01)
C23C 16/505   (2006.01)
(Continued)

(52) U.S. Cl.
CPC .. *H01J 37/32642* (2013.01); *H01J 37/32082* (2013.01); *H01J 37/32155* (2013.01);
(Continued)

(58) Field of Classification Search
CPC ......... H01J 37/32642; H01L 21/32136; C23C 16/505; C23C 16/509
(Continued)

(56) References Cited

U.S. PATENT DOCUMENTS 6,095,084 A * 8/2000 Shamouilian ........... C23C 16/00
118/723 E
6,232,236 B1 * 5/2001 Shan .................. H01J 37/32082
156/345.51
(Continued)

FOREIGN PATENT DOCUMENTS

CN   103227091 A   7/2013
CN   103715049 A   4/2014
(Continued)

*Primary Examiner* — Karl Kurple
(74) *Attorney, Agent, or Firm* — WOMBLE BOND DICKINSON (US) LLP; Joseph Bach, Esq.

(57) ABSTRACT

A plasma reactor having tunable low frequency RF power coupling to annular electrode. The reaction chamber has electrically conductive base connected to a low frequency RF source via RF match. An electrostatic chuck is attached to the electrically conductive base. An outer sidewall of the electrically conductive base is coated with plasma corrosion-resistance dielectric layer. A coupling ring is made of a dielectric material and surrounds an outer perimeter of the base. A focus ring is disposed above the coupling ring, the focus ring being arranged to surround the electrostatic chuck and be exposed to the plasma. The plasma reactor further comprises an annular electrode that is disposed above the coupling ring but below the focus ring, a wire having a first end electrically connected to the base, and a second end connected to the annular electrode. A variable capacitance is serially connected to the wire.

10 Claims, 5 Drawing Sheets

(51) Int. Cl.
   *H01L 21/683* (2006.01)
   *H01L 21/687* (2006.01)
   *B05C 13/02* (2006.01)

(52) U.S. Cl.
   CPC .. *H01J 37/32183* (2013.01); *H01J 37/32495* (2013.01); *H01J 37/32541* (2013.01); *H01J 37/32577* (2013.01); *H01L 21/6831* (2013.01); *H01L 21/6833* (2013.01); *H01L 21/68721* (2013.01); *B05C 13/02* (2013.01); *H01J 37/32091* (2013.01); *H01J 37/32165* (2013.01); *H01J 37/32174* (2013.01); *H01J 37/32715* (2013.01); *H01J 2237/2007* (2013.01); *H01J 2237/3341* (2013.01)

(58) Field of Classification Search
   USPC .......................................................... 438/729
   See application file for complete search history.

(56) References Cited

U.S. PATENT DOCUMENTS

| | | | |
|---|---|---|---|
| 6,478,924 B1 * | 11/2002 | Shamouilian | H01J 37/32706 118/723 I |
| 7,132,618 B2 * | 11/2006 | Hoffman | H01J 37/3244 219/121.43 |
| 7,193,168 B1 | 3/2007 | Gilliland et al. | |
| 7,758,764 B2 | 7/2010 | Dhindsa et al. | |
| 8,070,911 B2 * | 12/2011 | Himori | H01J 37/32532 156/345.44 |
| 8,124,539 B2 * | 2/2012 | Endoh | H01L 21/67069 438/729 |
| 8,222,157 B2 * | 7/2012 | Marakhtanov | H01J 37/32091 438/758 |
| 8,293,068 B2 | 10/2012 | Koshimizu et al. | |
| 8,617,351 B2 * | 12/2013 | Hoffman | H01J 37/32091 156/345.46 |
| 8,904,957 B2 * | 12/2014 | Kikuchi | H01J 37/3244 118/723 E |
| 9,396,908 B2 | 7/2016 | Marakhtanov et al. | |
| 9,437,402 B2 * | 9/2016 | Kikuchi | H01J 37/3244 |
| 9,728,381 B2 * | 8/2017 | Kikuchi | H01J 37/32642 |
| 10,002,744 B2 * | 6/2018 | Chen | H01J 37/32935 |
| 2003/0056901 A1 * | 3/2003 | Nakano | H01J 37/32183 156/345.47 |
| 2003/0201069 A1 | 10/2003 | Johnson | |
| 2004/0050327 A1 * | 3/2004 | Johnson | H01J 37/32082 118/640 |
| 2004/0163593 A1 * | 8/2004 | Aota | H01J 37/32174 118/723 E |
| 2005/0079737 A1 * | 4/2005 | Kellerman | H01L 21/6831 438/704 |
| 2006/0221540 A1 * | 10/2006 | Himori | H01J 37/32532 361/234 |
| 2007/0091006 A1 | 4/2007 | Thober et al. | |
| 2007/0113981 A1 * | 5/2007 | Brcka | H01J 37/321 156/345.48 |
| 2008/0182416 A1 * | 7/2008 | Collins | H01J 37/32165 438/714 |
| 2008/0236749 A1 | 10/2008 | Koshimizu et al. | |
| 2010/0006225 A1 | 1/2010 | Yokogawa et al. | |
| 2010/0012274 A1 | 1/2010 | Miyagawa et al. | |
| 2010/0025369 A1 | 2/2010 | Negishi et al. | |
| 2010/0203736 A1 | 8/2010 | Ichino et al. | |
| 2010/0243162 A1 | 9/2010 | Koshimizu | |
| 2010/0326957 A1 * | 12/2010 | Maeda | H01J 37/32642 216/67 |
| 2011/0126405 A1 * | 6/2011 | Baek | H01J 37/32577 29/825 |
| 2012/0216955 A1 * | 8/2012 | Eto | C23C 16/4404 156/345.51 |
| 2012/0252141 A1 * | 10/2012 | Sundararajan | H01L 21/31116 438/5 |
| 2014/0054268 A1 | 2/2014 | Chen et al. | |
| 2015/0083333 A1 * | 3/2015 | Kikuchi | H01J 37/32623 156/345.53 |
| 2015/0170925 A1 * | 6/2015 | Chen | H01J 37/32642 438/758 |
| 2016/0307743 A1 * | 10/2016 | Brown | H01J 37/32724 |
| 2016/0351404 A1 * | 12/2016 | Aramaki | H01J 37/32715 |
| 2017/0018411 A1 | 1/2017 | Sriraman et al. | |
| 2019/0206703 A1 * | 7/2019 | Zhao | H05H 1/46 |

FOREIGN PATENT DOCUMENTS

| | | |
|---|---|---|
| CN | 103811247 A | 5/2014 |
| CN | 203800029 U | 8/2014 |
| CN | 104241070 A | 12/2014 |
| CN | 106415779 A | 2/2017 |
| IN | 101720501 A | 6/2010 |
| JP | 2010021404 A | 1/2010 |
| KR | 1020100092348 A | 8/2010 |
| KR | 1020160101021 A | 8/2016 |
| TW | 506234 B | 10/2002 |
| TW | 200908063 A | 2/2009 |
| TW | 201003771 A | 1/2010 |
| TW | 201127222 A | 8/2011 |
| TW | 201334633 A | 8/2013 |

* cited by examiner

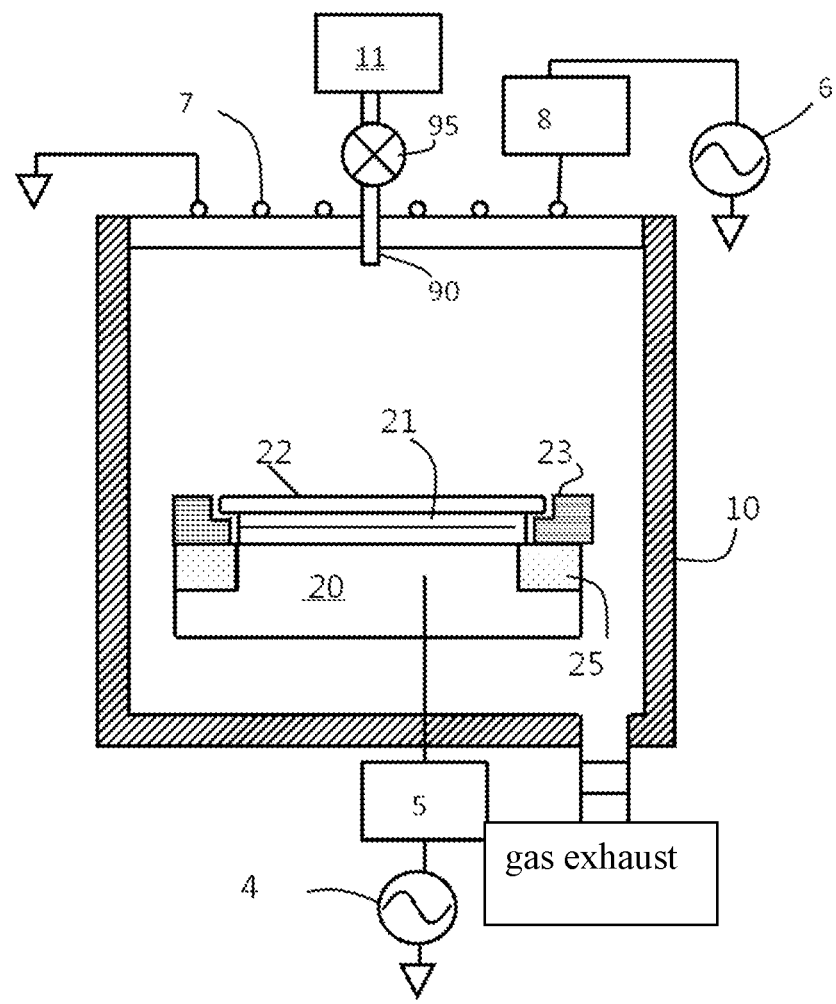
FIG. 1a – Prior Art

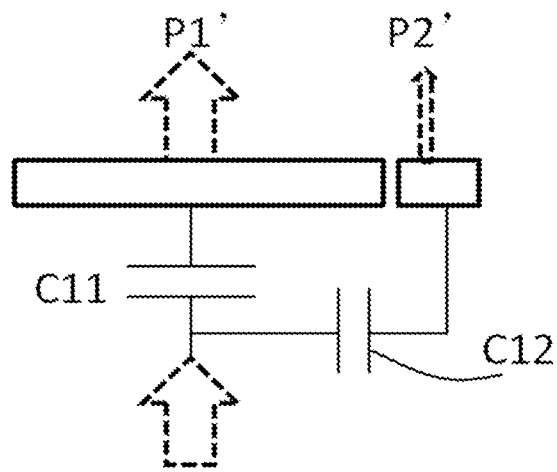
low frequency RF power input P0
FIG. 1b – Prior Art
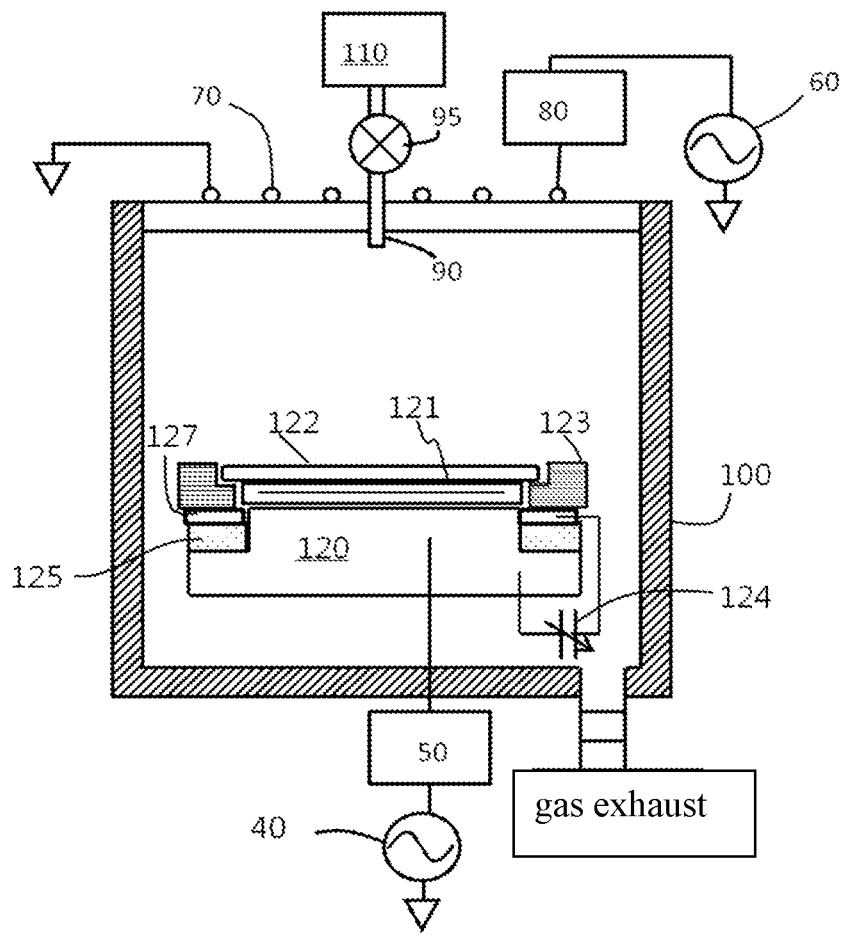
FIG. 2a low frequency RF power input P0

PLASMA REACTOR HAVING A VARIABLE COUPLING OF LOW FREQUENCY RF POWER TO AN ANNULAR ELECTRODE

RELATED APPLICATION

This application claims priority benefit from Chinese Patent Application No. 201710533117.X, filed Jul. 3, 2017, the disclosure of which is hereby incorporated herein by reference in its entirety.

FIELD

Embodiments of the present disclosure relate to the field of semiconductor processing technologies, and more particularly relate to a plasma reactor having a function of tuning low frequency RF power distribution.

BACKGROUND

An increasingly wide application of semiconductor chips is found in electronic devices, while many plasma processors are needed during the manufacturing procedure of semiconductor chips, which processors perform processing such as plasma etching and CVD (Chemical Vapor Deposition) to substrates. FIG. 1a illustrates a typical processor for plasma etching, wherein the processor comprises a reaction chamber 10 a top portion of which includes a dielectric window, an inductive coil 7 being provided above the dielectric window, the inductive coil 7 being connected to a high frequency (13 MHz and above) radio-frequency (RF) source 6 via an RF matching device 8; the processor further comprises at least one reactant gas source 11 (110 in FIGS. 2-5) which feeds the reactant gas into the reaction chamber via a valve 95 and an injector 90 to form a plasma to etch a substrate. A base 20 is provided at a lower portion of the inside space of the reaction chamber 10, the base being connected to a bias RF source 4 via a bias RF power matching device 50, wherein the frequency outputted by the bias RF source is generally below 2 MHz. A bottom portion of the reaction chamber 10 further includes a gas exhaust device to exhaust gas so as to maintain a low pressure inside the reaction chamber, and a valve 3 tuning an internal pressure by tuning an openness degree of the valve. The base 20 is usually made by surface anodized aluminum alloy, or by coating a layer of corrosion-resistance dielectric material on the surface of the aluminum alloy, so as to avoid corrosion by an etching gas in the reaction chamber, which would otherwise cause a series of problems such as particle contamination. An electrostatic chuck 21 is provided at an upper surface of the base, for fixing the substrate 22 to the upper surface of the electrostatic chuck. A raised step is further provided at a lower sidewall of the base, and a coupling ring 25 is provided on the step, wherein distribution of RF energy coupled to a substrate edge area is changed based on the material and shape of the coupling ring 25 as selected. A focus ring 23 is provided above the coupling ring 25, wherein an inner wall of the focus ring 23 surrounds and closely approaches the substrate 22; and an upper surface of the focus ring 23 is exposed to the plasma above. During the plasma processing process, a bias RF power is used for controlling the thickness of a sheath formed on the upper surface of the substrate and the focus ring, wherein the thicknesses of the sheath determines energy and direction of the ions in the plasma incident to the substrate. If the sheath of the substrate edge area and the sheath of the focus ring are not continuously distributed, the etching speed and etching direction in the substrate edge area (edge tilting) would be caused inconsistent with those in the substrate central area, which deteriorates the uniformity of substrate processing and lowers the yield of final chips.

Because the focus ring 23 is retained in a plasma filled with an etching gas for a long term, the surface material of the focus ring 23 will be surely corroded after being subjected to plasma processing for a certain duration, and the height of the upper surface of the focus ring will also decrease accordingly; the decreased height will seriously affect the distribution and modality of the sheath in the substrate edge area; to compensate the plasma processing result drift occurring during long-term working, a corresponding compensation mechanism or method needs to be devised. In some prior arts, an annular cavity is provided inside the coupling ring 25 or the focus ring, and dielectric fluid is introduced in the cavity, so as to tune a bias RF power distributed above the focus ring by tuning the amount or composition of the dielectric fluid, thereby compensating the processing result drift caused by height change of the focus ring. However, this method requires providing a dielectric fluid supply pipeline inside the reaction chamber and further providing a hermetic cavity inside the components such as couple ring or focus ring; besides, it's difficult to measure the height of dielectric fluid level when employing this method; therefore, in industry practice, this method will result in a higher complexity in structures of components and a higher cost; moreover, it is very difficult to perform precise and fine tuning to electric field distribution. In some other prior arts, a mechanical driving device is provided in the reaction chamber to drive the coupling ring 25 or the focus ring 23 to move finely up or down so as to change the electric field distribution in the substrate edge area. However, this method will cause particle contamination to movable parts; besides, it is also hard to precisely locate the coupling ring 25 and focus ring 23 in movement, where a location displacement even under 1 mm will result in nonuniform processing distribution processing result. Besides their own problems, the two tuning methods above also have a most serious common defect: they have little effect on the low frequency RF power coupled to the focus ring 23, and to effectively improve power distribution, a large-amplitude tuning is necessary. As shown in FIG. 1b, the input low frequency RF power P0 passes through an equivalent capacitance C11 between a base 20 and a substrate 22 to couple power P1' to the substrate, and meanwhile passes through an equivalent capacitance C12 derived from the capacitances of the base 20 through the coupling ring 25 to the focus ring 23, where the value of the C12 is very small and not easily tunable, such that P2' would be far smaller than P1' and a ratio between the powers cannot be tuned easily. To increase the C12, a highly electrically conductive material such as aluminum and silicon carbide may be selected to manufacture the coupling ring 25. However, such a compensating approach through material selection can only compensate for a certain period, which cannot dynamically compensate the processing result drift caused by consuming of the focus ring.

Therefore, a new tuning apparatus is desired in the industry, so as to finely and precisely tune low frequency RF power distribution in substrate center and edge areas, thereby improving the uniformity of substrate processing technique. Most preferably, the tuning apparatus is required to have a simple structure and a low cost and be applicable to various plasma processing equipment.

SUMMARY

Embodiments of the present disclosure provide a plasma reactor, which may simply and effectively tune an RF power in a substrate edge area and compensate substrate edge titling caused by consuming of a focus ring during long-term use. Embodiments of the present disclosure disclose a plasma reactor having a function of tuning low frequency RF power distribution, comprising:

a reaction chamber in which an electrically conductive base is provided, the electrically conductive base being connected to a low frequency RF source 40 via a first matching device 50, an electrostatic chuck being provided on the electrically conductive base, an upper surface of the electrostatic chuck being configured for fixing a substrate prior to processing, an outer sidewall of the electrically conductive base being provided with at least one layer of plasma-resistance dielectric layer, a coupling ring made of a dielectric material being arranged to surround an outer perimeter of the base, a focus ring being disposed above the coupling ring, the focus ring being arranged to surround the electrostatic chuck and to be exposed to a plasma during a plasma processing procedure; the plasma reactor further comprising an annular electrode disposed above the coupling ring but below the focus ring; a wire, a first end of which is electrically connected to the base, and a second end of which is connected to the annular electrode, a variable capacitance being serially connected to the wire.

wherein a frequency of RF signals outputted by the low frequency RF source is lower than 13 MHz, and preferably, the frequency of the RF signals outputted by the low frequency RF source is lower than 2 MHz.

The reactor further comprises a gas inlet device and a high frequency RF source, wherein the high frequency RF source outputs a high frequency RF power to the reaction chamber, such that a reactant gas introduced in the reaction chamber generates a plasma, and wherein a frequency of RF signals outputted by the high frequency RF source is higher than 13 MHz.

The present disclosure may be applied to a CCP (Capacitively-Coupled Plasma) reaction chamber, wherein an upper electrode is provided on top of the CCP reaction chamber, via which upper electrode the reactant gas is fed into the reaction chamber, the high frequency RF source being connected to the base or the upper electrode. The present disclosure may also be applied to an ICP (Inductively-Coupled Plasma) reaction chamber, wherein a dielectric window 72 is provided on top of the ICP reaction chamber, an inductive coil 70 is disposed above the dielectric window 72, and the high frequency RF source 60 transports an RF power to the inductive coil 70 via a second RF match 80.

The variable capacitance in the present disclosure is disposed below the base, and preferably, a hermetic baffle plate is provided at bottom of the reaction chamber, wherein the variable capacitance is disposed in an atmospheric environment below the hermetic baffle plate. The chamber wall of the reaction chamber is formed by a grounded metal, the grounded metal forming an electric field shielding space in which the variable capacitance is positioned, wherein the plasma-resistance dielectric layer of the outer sidewall of the electrically conductive base is made of aluminum oxide or aluminum yttrium, and the coupling ring is made of silicon oxide or aluminum oxide.

The electrically conductive connection part of the plasma reactor in the embodiments of the present disclosure may also comprise a plurality of branch wires each being uniformly distributed below the focus ring, one ends of the plurality of branch wires being connected to the annular electrode, and the other ends thereof being connected to a common variable capacitance. Or, the plurality of branch wires are uniformly distributed below the focus ring, first ends of the plurality of branch wires being connected to the annular electrode, and the other ends thereof being connected to the base, wherein each branch wire is serially connected with its own variable capacitance. Further, the annular electrode comprises a plurality of arc-shaped electrically conductive sheets, a gap or an insulating part being provided between every two arc-shaped electrically conductive sheets, such that every electrically conductive sheet is electrically insulated from another one, and the first ends of the plurality of branch wires being respectively connected to the plurality of arc-shaped electrically conductive sheets. In this way, sector-by-sector independent tuning of sheath thickness is implemented for the annular area at the entire substrate edge.

BRIEF DESCRIPTION OF THE DRAWINGS

FIG. 1a is a schematic diagram of a plasma processor in the prior art;

FIG. 1b is a schematic diagram of distribution of medium and low frequency RF powers in a plasma processor in the prior art;

FIG. 2a is a schematic diagram of a plasma processor in the present disclosure;

DETAILED DESCRIPTION OF EMBODIMENTS

Figure 2B:
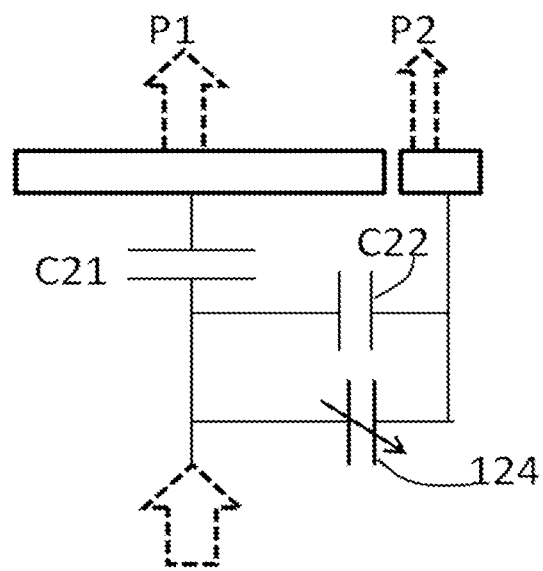
FIG. 2b is a schematic diagram of distributions of medium and low frequency RF powers in a plasma processor of the present disclosure.

Hereinafter, a preferred embodiment of the present disclosure will be further illustrated with reference to FIG. 2.

Through researching, the inventors find that when a high frequency RF power is inputted in a base 120, the RF power can be easily coupled to the focus ring, because for a high frequency signal, the thin (tens of microns) dielectric corrosion-resistance layer at a surface of the base 120 and the coupling ring 125 have a very small impedance. However, for a low frequency RF signal, a lower frequency causes a large impedance for the same dielectric layer and the coupling ring 125, and this impedance results in that only very little low frequency energy can be coupled to the focus ring 123, such that no matter what solutions are employed to tune the dielectric constants and positions of the coupling ring and the focus ring, the final tunable scope is still very limited. Because the dielectric corrosion-resistance layer at the sidewall of the base 120 is indispensable and the coupling ring is always made of a dielectric material such as aluminum oxide or silicon oxide, it is impossible to tunably distribute the low frequency RF power to the focus ring 123 at the substrate edge without hardware improvement; although the coupling ring may also be made of a highly electrically conductive material, such a coupling ring can only achieve a relatively good etching effect in a short term, and as the time elapses, it still cannot compensate the processing result drift caused by consuming of the focus ring. Moreover, besides affecting the distribution of low frequency RF power, the highly electrically conductive coupling ring also affects distribution of the high frequency RF power distribution; therefore, tuning of the thickness of the sheath above the focus ring undesirably causes nonuniform distribution of plasma density, which cannot improve the overall plasma processing result either. The focus ring 123 is usually made of a dielectric material such as quartz and aluminum oxide or a semiconductor material such as silicon carbide and silicon so as to avoid the substrate from being contaminated by the particles produced during the plasma processing process while providing sufficient electrical conductivity.

Based on this finding, the present disclosure provides a novel plasma processing chamber shown in FIG. 2a, whose basic structure is identical to the prior art shown in FIG. 1a, except that an electrically conductive connection part is applied for transmitting the low frequency RF power, wherein the electrically conductive connection part is typically a wire, the wire being directly guided till above the coupling ring but below the focus ring and meanwhile a variable capacitance 124 being serially connected on the wire. As shown in FIG. 2a, an annular electrode 127 is disposed above the coupling ring 125 and the focus ring is disposed on the annular electrode; a first end of the wire is directly electrically connected to the annular electrode 127, the other end thereof is directly electrically connected to the base 120, and a variable capacitance 124 is serially connected on the wire, such that the low frequency RF power transported to the focus ring is tuned by tuning a capacitance value of the variable capacitance 124. The annular electrode 127 may be made of any electrically conductive material, e.g., aluminum, graphite, etc., as long as the material may provide a good electrical conductivity. The variable capacitance of the present disclosure may be disposed in a vacuum space below the electrically conductive base 120; most preferably, the variable capacitance 124 is disposed in an atmospheric environment below the hermetic baffle plate in the reaction chamber, only required to allow the two ends of the wire to pass through the hermetic baffle plate; disposing the variable capacitance in the atmospheric environment facilitates heat dissipation and maintenance. A reaction chamber wall 100 is formed by a grounded metal, the grounded metal forming an electric field shielding space, such that as long as the variable capacitance 124 is disposed within the electric field shielding space of the reaction chamber, even it is in the atmospheric environment below the hermetic baffle plate, radiation of a low frequency electric field from the variable capacitance 124 to the external environment may still be avoided. Compared with the prior art in which a fluid inlet and outlet pipeline and a mechanical driving device are required in the vacuum reaction chamber, the variable capacitance in the present disclosure not only has a small size and a low cost, but also has a simple mechanical structure.

FIG. 2b shows an equivalent circuit diagram and an RF power distribution diagram of the present disclosure. In the present disclosure, the equivalent capacitance C21 coupled to the substrate center is still large, such that the main power can be coupled to the substrate, but the equivalent capacitance C22 derived from the capacitances of the base 120 through a sidewall corrosion-resistance dielectric layer and the coupling ring 125 to the focus ring 123 is still very small, which cannot transport a relatively large RF power. The variable capacitance 124 does not transport the RF power in a traditional coupling manner; instead, it directly conducts the RF power in the base 120 to a lower surface of the target focus ring 123 in a direct electrical connection manner, thereby bypassing the impedance that seriously affects low frequency RF power coupling, wherein the variable capacitance 124 may adaptively select a value range and a tuning range according to needs; therefore, by simply tuning the capacitance value, the variable capacitance 124 of the present disclosure may effectively tune the low frequency RF power transported to the focus ring 123. When the reaction chamber is in an initial state, the variable capacitance is at an initial value; after a long-time plasma processing, when it is detected that the processing result in the substrate edge area is different from the center, the controller may real-time automatically change the capacitance value of the variable capacitance based on a set parameter, such that more low frequency RF power is transported to the focus ring at the substrate edge, further raising the sheath at the focus ring, making the sheath in substrate edge area and above the focus ring have the same height, thereby improving etching uniformity. A typical defect of the processing result is the edge tilting of the etching hole in the substrate edge area. Once the upper surface of the focus ring consumed causes decreasing of the height and correspondingly thinning of the sheath in the edge area, the etching hole in the substrate edge area will have an inward tilting angle. The substrate processing result is continuously detected until the uniformity of processing result deviates again from a preset threshold, and then the capacitance value of the variable capacitance is re-tuned based on the detected data. In this way, the present disclosure may prevent frequent replacement of the focus ring in a long term and maintain a stable plasma processing result only by changing parameters of the variable capacitance without a need of providing a fluid pipeline or mechanical driving means in the vacuum environment.

Besides the inductively-coupled plasma (ICP) processor shown in FIGS. 1-2, the present disclosure may also be applied to a capacitively-coupled plasma (CCP) processor, where what is provided on top of the reaction chamber of the capacitively-coupled plasma processor is not a dielectric window, but an electrically conductive upper electrode in a flat showerhead shape, via which upper electrode the reactant gas is fed to a reaction area below. The high frequency RF power (13 MHz above, e.g. 27 MHz, 60 MHz) may be transported to the base 120 serving as a lower electrode; at this point, the upper electrode is grounded; alternatively, the high frequency RF power may also be transported to the upper electrode. In the CCP reactor, the dielectric parameters of the coupling ring and the focus ring will simultaneously affect distributions of high frequency and low frequency RF powers; however, with the electrical conduction path provided in the present disclosure, the high frequency RF power is mainly transported to the focus ring 123 by way of coupling, while part of the low frequency power is coupled to the focus ring 123 via the coupling ring 125, and the other part thereof, which is tunable, is transported to the focus ring 123 by way of direct conduction; therefore, the present disclosure further has a function of separately tuning the high frequency and low frequency RF powers, so as to more accurately tune the plasma density distribution (high frequency power dominated) and sheath distribution (low frequency power dominated) from the center to the edge of the upper surface of the substrate.

Based on the prior art setting which only utilizes the coupling ring to couple the low frequency RF energy, the present disclosure additionally provides a low frequency RF energy supply circuit whose structure is simple and whose power is tunable. The equivalent capacitance C22 of the lower electrode coupled to the focus ring via the coupling ring and the variable capacitance 124 additionally provided by the present disclosure jointly determine the low frequency RF power distributed to the focus ring, wherein the coupling ring may be preferably made of a dielectric material; in this way, the C22 is relatively small, but added with the additional variable capacitance 124, the capacitance tuning range may be much broader. If the coupling ring 125 is made of a highly electrically conductive material, the present disclosure may be still effective, except that the tuning range for the equivalent capacitance of C22 plus 124 is slightly different.

The dielectric layer has a very large impedance to the low frequency RF signal, such that even a very thin plasma resistance coating (formed by A1203 or Y203) will appreciably affect the power for coupling the low frequency RF power to the focus ring at the substrate edge. As parameter combinations of the thickness and composition of the dielectric coating layer and the coupling ring vary, their impedances to corresponding RF frequencies are also different. RF power in specific frequency band cannot be effectively transported to the focus ring. Particularly, in the case of a larger thickness or a higher coupling ring dielectric coefficient, the specific frequency band will be moved to a higher frequency band. Therefore, the low frequency RF signal in the present disclosure is usually lower than 2 MHz, and the effect is most appreciable particularly when lower than 1 MHz, e.g. 400 KHz. However, as long as an application circumstance requires, an RF signal higher than 2 MHz, e.g. 13 MHz, may also adopt connection wires of the present disclosure, causing the low frequency RF power to be transported to the focus ring in an effective and tunable manner.

Figure 3:
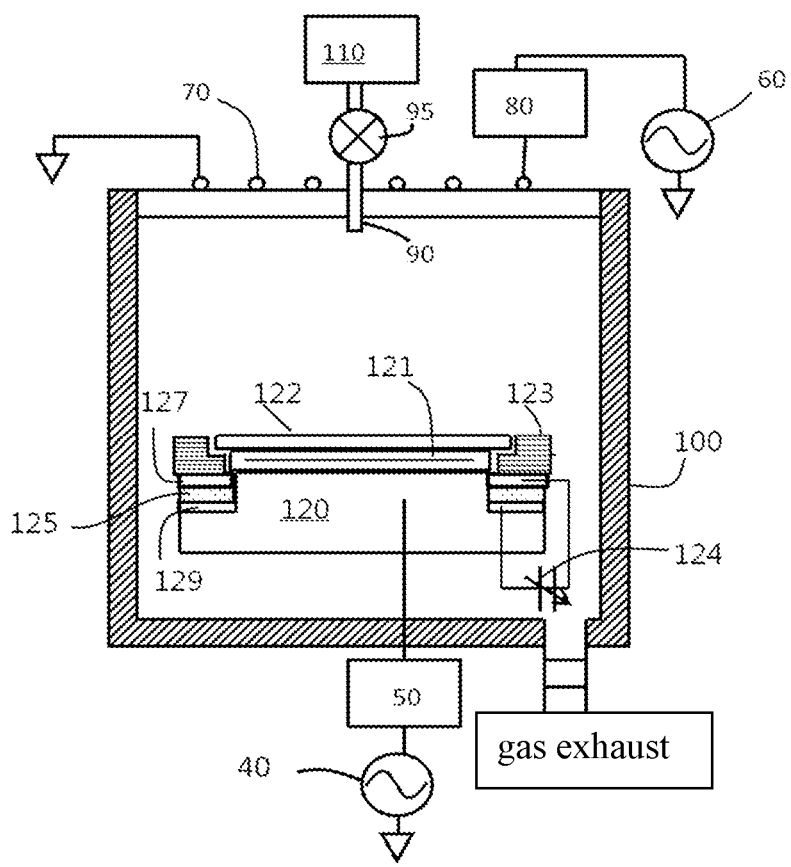
FIG. 3 is a schematic diagram of another embodiment of a plasma processor in the present disclosure.

As illustrated in FIG. 3, the present disclosure further provides another embodiment, the basic structure of which is identical to the first embodiment shown in FIG. 2, except that besides being directly connected to the lower electrode 120 via a wire 137 (see FIG. 4), the variable capacitance 124 may also be connected to an intermedia conductive part 129 which is made of an electrically conductive material and disposed above the upper surface of a step 79 (see FIG. 4) of the lower electrode 120 and below the coupling ring 125; the low frequency RF power of the lower electrode is inputted to the intermedia conductive part 129 by coupling the dielectric layer crossing the upper surface of the step, and then is transported to the annular electrode 127 via the wire and the variable capacitance 124, wherein the electrical conductive part, which may be annular or may include a plurality of separate conductors, surrounds the lower electrode sidewall. In a plasma processing apparatus, the electric field inputted to the lower electrode is mainly upward coupled to a top portion of the reaction chamber. In the prior art, the equivalent capacitance C12 laterally coupled to the focus ring 123 from the lower electrode is very small; however, in the present disclosure, the intermedia conductive part 129 is a conductor extending in a horizontal direction, such that a large number of upward electric field lines from the step of the lower electrode may pass through the dielectric corrosion-resistance layer at the top surface of the step to reach the electrically conductive part; therefore, the equivalent capacitance is far larger than C12 in the prior art. Accordingly, in the second embodiment of the present disclosure, by providing the intermedia conductive part 129 coupled to the electric field on the top surface of the step, the low frequency electric field may be guided to the annular electrode 127 above the coupling ring 125, so as to tune the low frequency RF energy in the substrate edge area.

Figure 4:
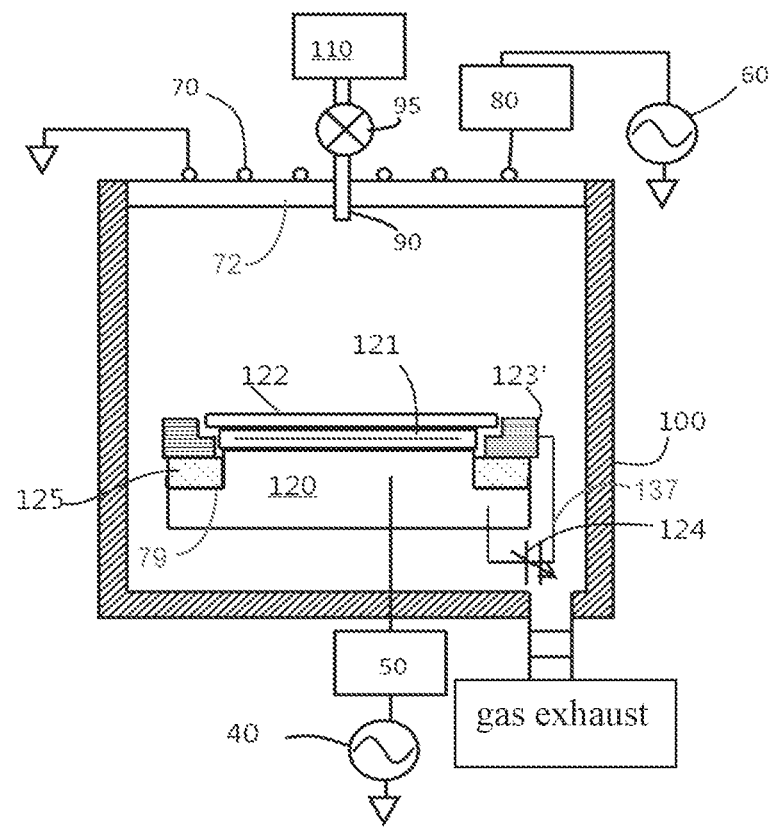
FIG. 4 is a schematic diagram of a third embodiment of a plasma processor in the present disclosure.
Figure 5:
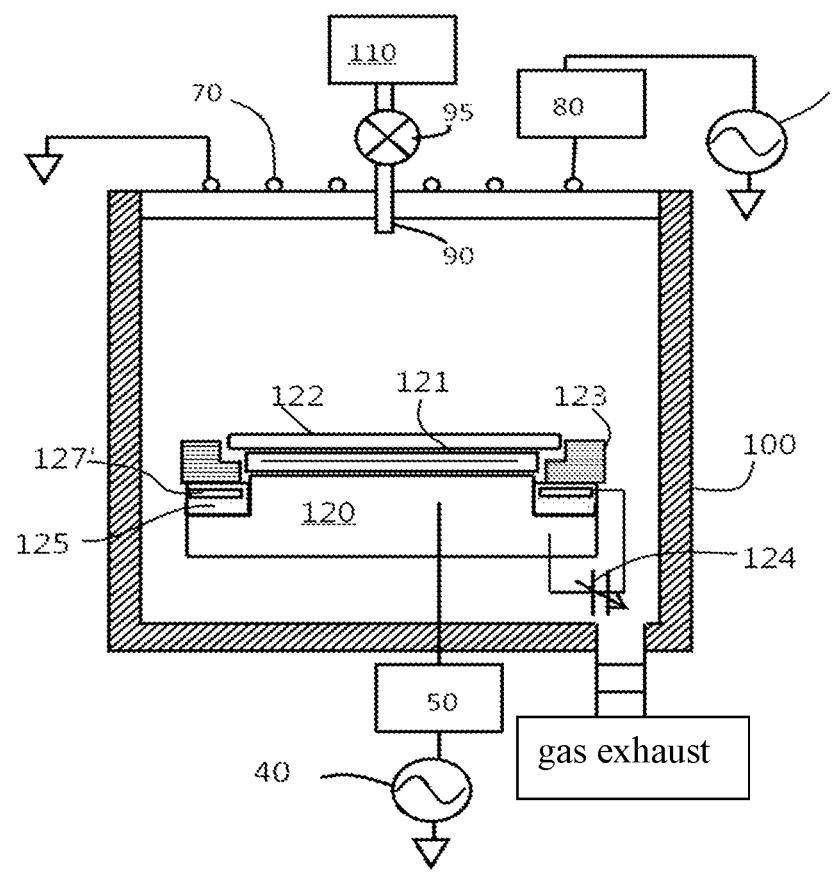
FIG. 5 is a schematic diagram of a fourth embodiment of a plasma processor in the present disclosure.

In the present disclosure, a lower end of the wire 137 (FIG. 4) may be directly electrically connected to the electrically conductive base 120 or coupled to the intermediate conductive part 129 of the electrically conductive base. On the other hand, besides connected to the annular electrode between the coupling ring 125 and the focus ring 123, the annular electrode may also be embedded in the focus ring 123, or as shown in the embodiment of FIG. 5, an annular electrode 127' is embedded in an upper half portion of the coupling ring 125 made of a dielectric material, such that although the equivalent capacitance coupled to the focus ring 123 from the lower electrode 120 is smaller than a value of the variable capacitance 124 shown in FIG. 2, it is still far larger than C12 in the prior art shown in FIG. 1, such that the object of the present disclosure may also be achieved. As shown in the embodiment of FIG. 4, when a focus ring 123' is made of a conductor or semiconductor material (silicon, silicon carbide, aluminum, etc.), the focus ring 123' per se may serve as the annular electrode of the present disclosure, such that at this point, the upper end of the wire may be directly connected to the focus ring 123'.

Besides, the electrically conductive connection part may also comprise a plurality of branch wires, and preferably, the plurality of branch wires are uniformly and symmetrically distributed in an outer peripheral of the base, such that each branch wire and its adjacent branch wires are spaced with a same distance but connected to different areas of the annular electrode. Hereinafter, another embodiment of the present disclosure will be illustrated with an example of 3 branch wires, where one end of each branch wire is connected to the annular electrode, and the other end thereof is commonly connected to a variable capacitance, and then connected to the base via the wire connected to the variable capacitance. Or, two ends of each branch wire are both connected to the electrically conductive base and the annular electrode, three independently tunable variable capacitance are serially connected to the three branch wires, and by tuning the three variable capacitance, the low frequency power may be uniformly distributed on the annular electrode from the three branch wires. Further, the annular electrode may be partitioned into three segments of arc-shaped electrically conductive plates which jointly form the annular electrode, wherein a gap or an insulating part is present between every two arc-shaped electrically conductive plates to thereby implement mutual electrical insulation; and by tuning the three variable capacitance, sheath thicknesses of different areas on the focus ring may be tuned area by area, thereby solving the problem of nonuniform sheath at some azimuths in the substrate edge annular area.

The variable capacitance in the present disclosure is only a best mode, and any other variable impedance devices that may tune the impedance of the low frequency power, including a hybrid circuit comprising a variable inductor and a capacitance arrangement, or a circuit formed by combination of other elements, may perform the function of impedance tuning. Such alternatives are common knowledge in the industry and thus will not be listed one by one.

Although the contents of the present disclosure have been described in detail through the foregoing preferred embodiments, it should be understood that the description above shall not be regarded as limitations to the present disclosure. After those skilled in the art have read the contents above, many modifications and substitutions to the present disclosure are all obvious. Therefore, the protection scope of the present disclosure should be limited by the appended claims.

The invention claimed is:

1. A plasma reactor having a function of tuning a bias frequency RF power distribution, comprising:
   a reaction chamber in which an electrically conductive base is provided at a lower portion of an inside space of the reaction chamber within a reaction chamber wall, the electrically conductive base being connected to a bias RF source via an RF match, an electrostatic chuck being provided on the electrically conductive base, an upper surface of the electrostatic chuck being configured for fixing a substrate, a coupling ring being arranged to surround an outer perimeter of the electrically conductive base, a focus ring made of semiconducting material being disposed above the coupling ring, the focus ring being arranged to surround the electrostatic chuck and to be exposed to a plasma during a plasma processing procedure, wherein a raised step is further provided at a lower sidewall of the electrically conductive base and the coupling ring is provided on the raised step;
and an electrically conductive connection part, the electrically conductive connection part comprising at least one wire, wherein a first end of the wire is directly electrically connected to the electrically conductive base or electrically connected to an intermediate conductive part coupled to the electrically conductive base, the intermediate conductive part being made of an electrically conductive material and disposed above an upper surface of the raised step and below the coupling ring, and a second end of the wire is electrically connected to the focus ring, wherein a variable capacitor being serially connected to the wire between the first end and the second end; wherein the variable capacitor is disposed in an atmospheric environment in the inside space below the electrically conductive base, wherein the reaction chamber wall is formed by a grounded metal, the grounded metal enclosing an electric field shielding space in which the variable capacitor device is positioned.

2. The plasma reactor according to claim 1, wherein the coupling ring is made of a dielectric material and disposed above the intermediate conductive part, and an outer sidewall of the electrically conductive base includes at least one layer of a plasma resistance dielectric layer.

3. The plasma reactor according to claim 1, wherein a frequency of RF signals outputted by the bias RF source is lower than 13 MHz.

4. The plasma reactor according to claim 3, wherein a frequency of RF signals outputted by the bias RF source is lower than 2 MHz.

5. The plasma reactor according to claim 1, wherein the reaction chamber further comprises a gas inlet device and a second frequency RF source, wherein the second frequency RF source outputs a second frequency RF power to the reaction chamber, such that a reactant gas introduced in the reaction chamber generates the plasma, and wherein a frequency of RF signals outputted by the second frequency RF source is higher than 13 MHz.

6. The plasma reactor according to claim 5, wherein a top portion of the reaction chamber includes a dielectric window, an inductive coil is disposed above the dielectric window, and the second frequency RF source transports an RF power to the inductive coil via a second RF matching device.

7. The plasma reactor according to claim 5, wherein the second frequency RF source is connected to the electrically conductive base.

8. The plasma reactor according to claim 2, wherein the plasma resistance dielectric layer is made of aluminum oxide or yttria.

9. The plasma reactor according to claim 1, wherein the coupling ring is made of silicon oxide or aluminum oxide.

10. The plasma reactor according to claim 1, wherein the electrically conductive connection part of the plasma reactor includes a plurality of branch wires, one end of each branch wire being connected to an annular electrode, the plurality of branch wires being connected to different regions of the annular electrode, the other end of each branch wire being connected to the variable capacitor device and further connected to the electrically conductive base or intermediate conductive part via the variable capacitor device.

* * * * *